United States Patent Office 3,269,836

Patented August 30, 1966

3,269,836

NOVEL LITHOGRAPHIC PLATEMAKING PROCESS

Paul W. Greubel, Great Neck, N.Y., and Frank A. Illari, Washington, D.C., assignors to Interchemical Corporation, New York, N.Y., a corporation of Ohio No Drawing. Filed Sept. 17, 1962, Ser. No. 224,221

11 Claims. (Cl. 96—33)

This invention relates to the making of lithographic plates. More particularly, this invention relates to a novel process which is an improvement in "albumin" or "surface-type" platemaking.

For many lithographic printing operations, plates prepared by "albumin" or "surface-type" processes are used instead of "deep-etch" lithographic plates. Because they do not have a "deep-etch" step, use water as a developer instead of more costly calcium or zinc chloride solutions and do not require anhydrous alcohol wash to remove the developer salts, surface plate processes are generally less expensive and more easily carried out than are deep-etch platemaking processes. However, surface plates have been less than desirable for many lithographic applications because of their plate-life which is considerably shorter than that of "deep-etch" type plates.

We have now discovered a new process for making lithographic plates which has all of the aforementioned desirable features of the "surface-type" process and produces a plate having considerably increased plate-life approaching that of "deep-etch" plates.

Like "surface-type" plate processes, the process of this invention employs a sensitized coating of albumin or like material and alkali dichromate which hardens on exposure to light. However, in all "surface-type" plates, the light hardened albumin-alkali dichromate layers, usually coated with lacquer coats the image area. The wearing away of this hardened albumin-alkali dichromate layer with use is believed to be responsible for the shorter plate life of "surface-type" plates. The plate produced by the process of this invention does not employ such a hardened albumin layer to cover the image area. Instead, it employs a non-blinding deep-etch lacquer in the image area.

The novel method of the invention may be used both in the production of plates for conventional lithographic printing in which the image areas are covered with a non-blinding "deep-etch" lacquer and the non-image areas are exposed metal and in the production of the novel planographic printing plates described in copending application Serial No. 141,538 in which the non-image areas are covered with a cured layer of a thermosetting silicone resin and the image areas are exposed metal. The disclosure of application Serial No. 141,538 is hereby incorporated into the instant application.

In the method of this invention a conventional lithographic plate base metal e.g., zinc or aluminum is coated with a conventional "albumin-type" coating. The term "albumin-type" as used in the specification and claims refers to the conventional coating used in "albumin-plates" or surface lithographic plates. Albumin-type plates comprise an alkali dichromate particularly ammonium dichromate together with a protein base which may be albumin or other proteins such as casein or soya bean protein. The coated surface is then exposed by conventional plate making techniques through a transparency which may be either a positive if the resulting plate is to be used in conventional lithographic printing or a negative if the resulting plate is the novel planographic plate described in the above mentioned application.

For convenience in this specification, the term "conventional lithographic plates" will be used to describe plates made by the process of this invention in which the while the term "novel planographic plates" will be used non-image areas in the final plate are exposed metal to describe plates in which the image areas in the final plate are exposed metal and the non-image areas are covered by a cured layer of thermosetting silicone resin.

It should also be noted that the term transparency is meant to be generic to both negatives and positives. In this specification and claims, all proportions are by weight unless otherwise stated.

After exposure, the plate is treated with a developer which may be either water or dilute ammonium hydroxide. This removes the unexposed and consequently unhardened portions of the coating. The developed surface is then over coated with either a non-blinding "deep-etch" lacquer in the case of conventional lithographic plates or with a thermosettting silicone resin in the case of the novel planographic plates.

The coated plate is then treated with an aqueous alkali solution which may be an ammonium hydroxide solution but is most preferably a solution of an alkali metal hydroxide such as sodium hydroxide or potassium hydroxide. For best results, the solution has a high alkalinity. A suitably high alkalinity may be achieved by using a sodium or potassium hydroxide solution which is preferably from 0.1 N to 0.5 N. This alkaline solution penetrates the overcoating to the remaining hardened albumin-type layer and dissolves the albumin-type layer, removing both the albumin-type layer as well as any portions of the overcoating which cover said layer. This leaves the overcoating covering the metal base in only the image areas in the case of the conventional lithographic plates or covering the metal base in non-image areas in the case of the novel planographic plates. Should the hardened albumin-type coating be difficult to remove using the aqueous alkali, scrubbing with the aqueous alkali has ben found to be very effective.

With respect to the overcoatings, in the preparation of conventional lithographic plates, the conventional "deep-etch" non-blinding lacquer is used. We are referring to this material by the term "deep-etch" because any known non-blinding lacquer which is conventionally used in the deep-etch process should be operable in this invention. The "deep-etch" non-blinding lacquers which give best results are the vinyl resin lacquers. These are solutions of vinyl resins in a wide variety of organic solvents including methyl ethyl ketone, methyl hexyl ketone, methyl isoamyl ketone, methyl isobutyl ketone, acetone, nitropropane isopropyl acetate, ethyl acetate and 2-ethylbutyl acetate. The term "vinyl resins" used in this specification and claims is used in the narrower sense of the term to cover primarily polymers and copolymers of vinyl acetate, vinyl chloride and vinylidene chloride (see volume I, Organic Coating Technology, H. F. Payne, 1954).

In the planographic plates, the silicones preferably used to coat the non-image areas are thermosetting alkyl and aryl substituted polysiloxanes including thermosetting alkyl siloxanes such as dimethylpolysiloxane resin, thermosetting alkyl-aryl polysiloxanes, for example a methylphenylpolysiloxane resin having an average degree of substitution of 1.3 methyl and phenyl radicals per silicone atom. Very good results have been achieved with a thermosetting polysiloxane copolymer comprising 37% by weight of dimethylsiloxane units ($(CH_3)_2SiO$), 56% of phenyl siloxane units ($CH_6H_5SiO_{1.5}$) and 7% methyl siloxane ($CH_3SiO_{1.5}$) units.

The following examples will further illustrate the practice of this invention:

EXAMPLE I

*Production of a conventional lithographic plate by our novel method*

A conventional "albumin-type" coating containing 11 parts of albumin, 2.7 parts of ammonium dichromate and 86.3 parts of water is coated on a zinc plate. The coated plate is exposed through a positive transparency to strong light such as an arc light. The exposed plate is developed, using water which removes the coating from the unexposed areas. The developed surface is then overcoated with a non-blinding deep-etch lacquer comprising a 10% solution in ethyl butyl ketone of a copolymer comprising 86 parts of vinyl chloride, 13 parts of vinyl acetate and 1 part of maleic acid monomers. The overcoated surface is then scrubbed with a 0.25 N potassium hydroxide solution until the metal is completely exposed in the non-image areas.

EXAMPLE II

*Production of the novel planographic plates by the method of this invention*

A conventional "albumin-type" coating containing 11 parts of albumin, 2.7 parts of ammonium dichromate and 86.3 parts of water is coated on a zinc plate. The coated plate is exposed through a negative transparency to strong light such as an arc light. The exposed plate is developed using a 0.5% solution of ammonia in water which removes the coating from the unexposed areas. The developed surface is then overcoated with a thermosetting polysiloxane copolymer comprising 37% by weight of dimethylsiloxane units ($(CH_3)_2SiO$), 56% of phenyl siloxane units ($C_6H_5SiO_{1.5}$) and 7% methyl siloxane ($CH_3SiO_{1.5}$) units by spreading the coating with rags or gauze and allowing to dry for 5 to 15 minutes. In order to increase the ease of spreading, the silicone coating may be diluted with a solvent such as xylene or toluene. The overcoated surface is then scrubbed with a 0.25 N potassium hydroxide solution until the metal is completely exposed in the image areas. The plate is then baked at 355° C. for 5 minutes to cure the overcoating.

While there have been described what is at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A method of making a lithographic plate which comprises coating a metal surface with an alkali dichromate light-sensitive coating, exposing said coating to light through a transparency, developing the coating by applying to said coating a developer selected from the group consisting of water and dilute ammonium hydroxide to remove the unexposed portions of the coating, overcoating the developed surface with a member selected from the group consisting of non-blinding "deep-etch" lacquers and polysiloxane resins and applying an aqueous alkali solution to the overcoated surface to remove the exposed light-sensitive coating together with the overcoating in areas where said overcoating lacquer covers said exposed light-sensitive coating.

2. A method of making a planographic printing plate which comprises coating a metal surface with an alkali-dichromate light-sensitive coating, exposing said coating to light through a negative, developing the coating by applying to said coating a developer selected from the group consisting of water and dilute ammonium hydroxide to remove the unexposed portions of the coating, overcoating the developed surface with a polysiloxane resin, applying an aqueous alkali solution to the overcoated surface to remove the exposed light-sensitive coating together with the polysiloxane resin overcoating in areas where said overcoating covers said exposed light-sensitive coating and curing the remaining polysiloxane resin overcoating.

3. A method of making a lithographic plate which comprises coating a metal surface with an alkali dichromate light-sensitive coating, exposing said coating to light through a positive, developing the coating by applying to said coating a developer selected from the group consisting of water and dilute ammonium hydroxide to remove the unexposed portions of the coating, overcoating the developed surface with a non-blinding deep-etch lacquer and applying an aqueous alkali solution to the over-coated surface to remove the exposed light-sensitive coating together with the non-blinding lacquer in areas where said overcoating lacquer covers said exposed light-sensitive coating.

4. The method set forth in claim 1 wherein said alkali-dichromate light-sensitive coating further comprises albumin.

5. The method set forth in claim 1 wherein said alkali-dichromate light-sensitive coating further comprises casein.

6. The method set forth in claim 1 wherein said alkali-dichromate light-sensitive coating further comprises soya bean protein.

7. The method set forth in claim 1 wherein said aqueous alkali is an alkali metal hydroxide.

8. The method set forth in claim 3 wherein said non-blinding lacquer is a solution of a vinyl resin in a volatile organic solvent.

9. The method claimed in claim 2 wherein said polysiloxane comprises dimethylpolysiloxane monomers.

10. The method claimed in claim 2 wherein said polysiloxane comprises methylphenylpolysiloxane.

11. The method claimed in claim 2 wherein said polysiloxane comprises dimethyl siloxane monomers, phenyl siloxane monomers and methylsiloxane monomers.

References Cited by the Examiner

UNITED STATES PATENTS

| | | | |
|---|---|---|---|
| 2,399,208 | 4/1946 | Coolidge | 101—149.2 |
| 2,692,827 | 10/1954 | Brinnick et al. | 96—33 |
| 2,804,388 | 8/1957 | Marron et al. | 96—33 |
| 2,865,873 | 12/1958 | Hodgins et al. | 96—33 X |
| 3,016,823 | 1/1962 | Thurlow | 96—33 X |

OTHER REFERENCES

Chemistry of Lithography, Lithographic Technical Foundation, New York, N.Y., 1961, 2nd edition, pages 138–150 and 173–174.

NORMAN G. TORCHIN, *Primary Examiner.*

R. L. STONE, C. BOWERS, *Assistant Examiners.*